(12) United States Patent
Liu et al.

(10) Patent No.: US 7,119,376 B1
(45) Date of Patent: Oct. 10, 2006

(54) LIGHT EMITTING DIODE COMPONENT CAPABLE OF EMITTING WHITE LIGHTS

(75) Inventors: Ru-Shi Liu, Hsin-Chu Hsien (TW); Chia-Cheng Kang, Taipei (TW); Hung-Yuan Su, Taipei Hsien (TW)

(73) Assignee: Lite-On Technology Corp., Taipei (TW)

( * ) Notice: Subject to any disclaimer, the term of this patent is extended or adjusted under 35 U.S.C. 154(b) by 0 days.

(21) Appl. No.: 11/163,053

(22) Filed: Oct. 3, 2005

(30) Foreign Application Priority Data

May 10, 2005 (CN) .................. 2005 1 0070194

(51) Int. Cl.
*H01L 29/22* (2006.01)
*H01L 29/24* (2006.01)
*H01J 1/62* (2006.01)

(52) U.S. Cl. ............... 257/98; 257/100; 257/E33.061; 313/502; 313/503

(58) Field of Classification Search .............. 257/89, 257/98, 100, E33.061; 313/502, 503; 252/301.6 R, 252/301.4 R; 428/690
See application file for complete search history.

(56) References Cited

U.S. PATENT DOCUMENTS

2006/0076883 A1* 4/2006 Himaki et al. ............. 313/503
2006/0124942 A1* 6/2006 Maeda et al. ................ 257/89

* cited by examiner

*Primary Examiner*—Minhloan Tran
*Assistant Examiner*—Kristopher Capella
(74) *Attorney, Agent, or Firm*—Winston Hsu

(57) ABSTRACT

A light-emitting diode (LED) component includes a light-emitting chip for emitting luminescent light, and a phosphor for absorbing first luminescent light of the luminescent light and emitting first emission, the first luminescent light having a first wavelength different from that of the first emission, the phosphor having a chemical formula of $(Ca_{1-x-y}Eu_xM_y)Se$ where x is not equal to zero, y is between zero and one, and M is composed of at least one element selected from a group consisting of Be, Mg, Sr, Ba, and Zn.

4 Claims, 5 Drawing Sheets

LIGHT EMITTING DIODE COMPONENT CAPABLE OF EMITTING WHITE LIGHTS

BACKGROUND OF THE INVENTION

1. Field of the Invention

The present invention relates to a light-emitting diode (LED), and more particularly, to a LED component having $(Ca_{1-x-y}Eu_xM_y)Se$ phosphor.

2. Description of the Prior Art

Having the advantages of low power consumption, long lifespan (about ten times as long as that of an incandescent lamp), and, most importantly, high color rendering index (CRI) such that a white light LED (W-LED) component is capable of generating visible radiation that will not damage art, it has become one of the most popular illuminating devices in a competitive market demanding a high CRI.

An easy method for making a W-LED component is to combine a blue light LED chip capable of emitting blue light and a red light LED chip capable of emitting red light with a green light LED chip capable of emitting green light to form the W-LED component. The W-LED component is therefore capable of emitting white light, which is formed by mixing the blue light, the red light, and the green light.

However, the above three-in-one W-LED component is expensive, for it has to include three LED chips. Moreover, since the three LED chips each have a light-emitting efficiency different from one-another (The light-emitting efficiency of the blue LED chip is higher than the light-emitting efficiency of the red/green LED chip), white light emitted by the three-chip-containing W-LED component has a low CRI.

In order to overcome the above drawbacks, Nichia Chemical Co. disclosed a W-LED component consisting of a single LED chip and phosphor having a chemical formula of $(Y_{1-p-q-r}Gd_pCe_qSm_r)_3(Al_{1-s}Ga_s)_5O_{12}$ where p is between 0–0.8, q is between 0.003–0.2, r is between 0.003–0.08, and s is between 0–1. The single LED chip is capable of emitting luminescent light. The phosphor is doped into epoxy resin used to cover the single LED chip. The phosphor is capable of absorbing luminescent light with predetermined wavelength, such as the luminescent light emitted by the single LED chip, and emitting an emission. As a result, the luminescent light emitted by the single LED chip, except for the luminescent light with the predetermined wavelength, combines with the emission emitted by the phosphor to form white light.

Since the W-LED component disclosed by Nichia Chemical Co. comprises nothing but the single LED chip and phosphor, a mature and cheap product, the W-LED component costs less.

However, in addition to the phosphor having the chemical formula of $(Y_{1-p-q-r}Gd_pCe_qSm_r)_3(Al_{1-s}Ga_s)_5O_{12}$, a variety of phosphors can be used to be combined with single LED chip to form a W-LED.

SUMMARY OF THE INVENTION

The primary purpose of the claimed invention is, therefore, to provide a white light emitting diode component.

According to the claimed invention, the W-LED component includes a light-emitting chip for emitting luminescent light, and a phosphor for absorbing first luminescent light of the luminescent light and emitting first emission, the first luminescent light having a first wavelength different from that of the first emission, the phosphor having a chemical formula of $(Ca_{1-x-y}Eu_xM_y)Se$ where x is not equal to zero, y is between zero and one, and M comprises at least one element selected from a group consisting of Be, Mg, Sr, Ba, and Zn.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
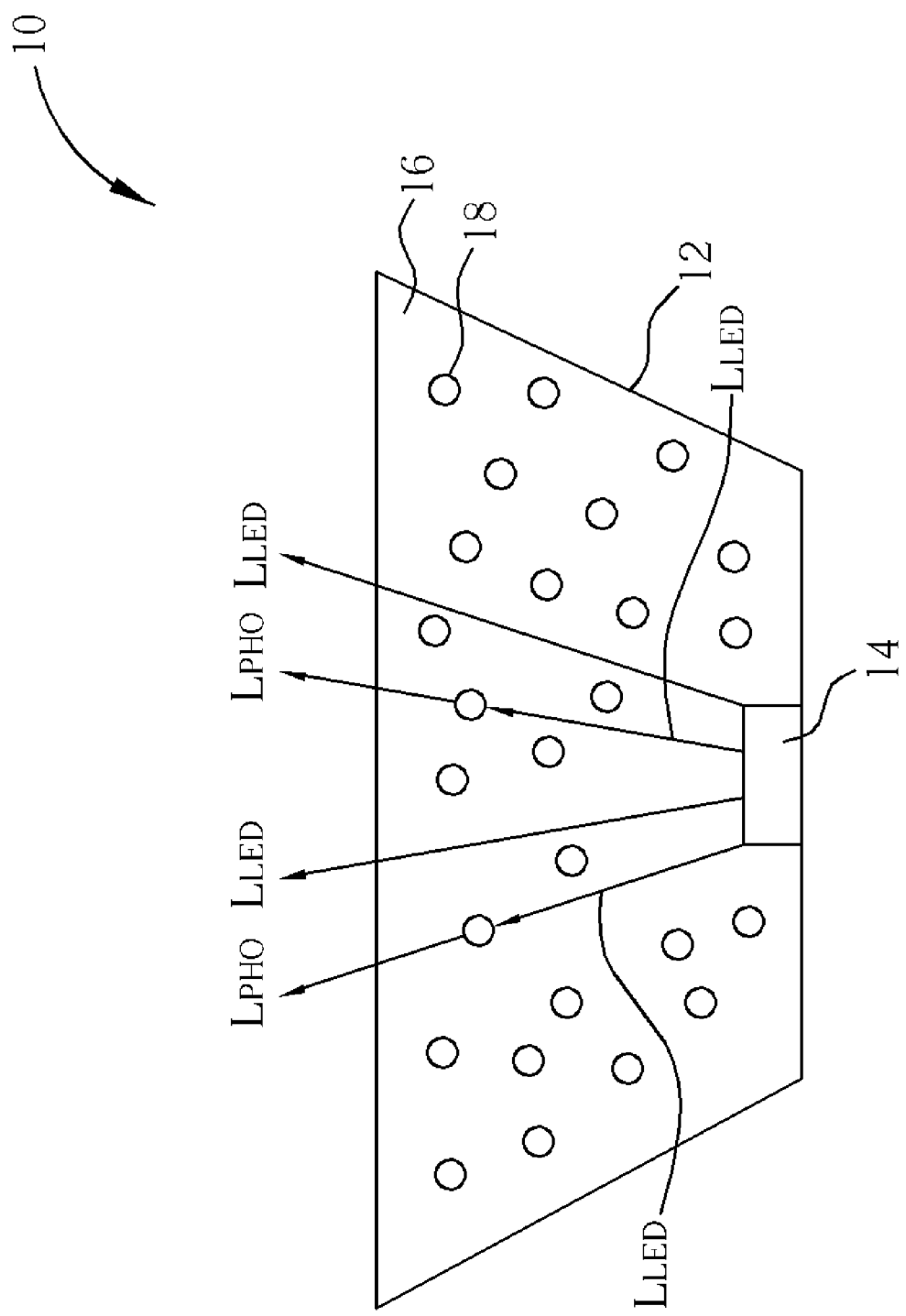
FIG. 1 is a schematic diagram of a W-LED component of the preferred embodiment according to the present invention.

Please refer to FIG. 1, which is a schematic diagram of a W-LED component 10 of the preferred embodiment according to the present invention. The W-LED component 10 is capable of emitting white light. The component 10 comprises a cup-shaped housing 12, an LED chip 14 installed on a bottom part of the housing 12 for emitting luminescent light $L_{LED}$, epoxy resin 16 filled into the housing 12 for covering the LED chip 14, and phosphor 18 doped into the epoxy resin 16 for absorbing part of the luminescent light $L_{LED}$ emitted by the LED chip 14 and emitting emission $L_{PHO}$. The emission $L_{PHO}$ has a wavelength different from a wavelength of the luminescent light $L_{LED}$.

Although the W-LED component 10, which is capable of emitting white light, is used as an embodiment to describe the present invention, the present invention applies to any LED component capable of emitting white light.

According to the present invention, the luminescent light $L_{LED}$ emitted by the LED chip 14 has a dominant wavelength of between 440 and 510 nanometers. That is, the luminescent light $L_{LED}$ emitted by the LED chip 14 is between blue and green. The phosphor 18 has a chemical formula of $(Ca_{1-x-y}Eu_xM_y)Se$, where x is not equal to zero, y is between zero and one, and M is composed of at least one element selected from a group consisting of Be, Mg, Sr, Ba, and Zn. The phosphor 18 absorbs the blue (or green) light $L_{LED}$, and emits the emission $L_{PHO}$, which is orange. The CaSe acts as a host of the phosphor 18. Eu, as well as M, acts as foreign ions doped into the host, and can be incorporated into the host to form an activator capable of emitting the emission $L_{PHO}$.

As a result, the component 10 emits in equivalence white light $L_{WH}$, which has a color temperature of about 3018 K and is a mix of the luminescent light $L_{LED}$ (except for the portion absorbed by the phosphor 18) and the emission $L_{PHO}$ emitted by the phosphor 18.

To improve the CRI and uniformity of the white light $L_{WH}$ emitted by the W-LED component 10, the phosphor 18 has a particle diameter smaller than 20 micrometers and an average particle diameter equal to five micrometers.

Figure 2:
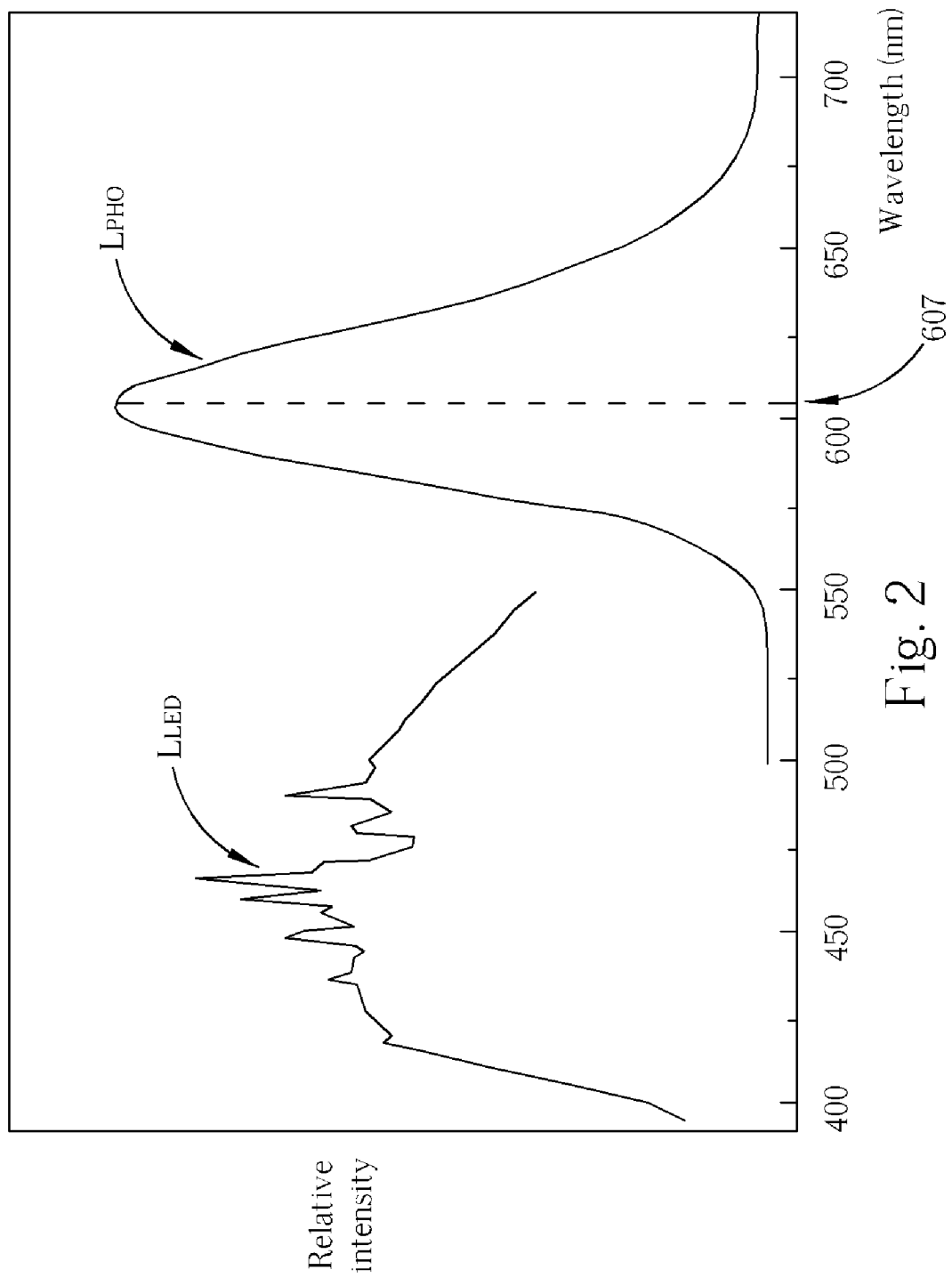
FIG. 2 is a spectral diagram of excitation and emission of a phosphor of the W-LED component shown in FIG. 1.
Figure 3:
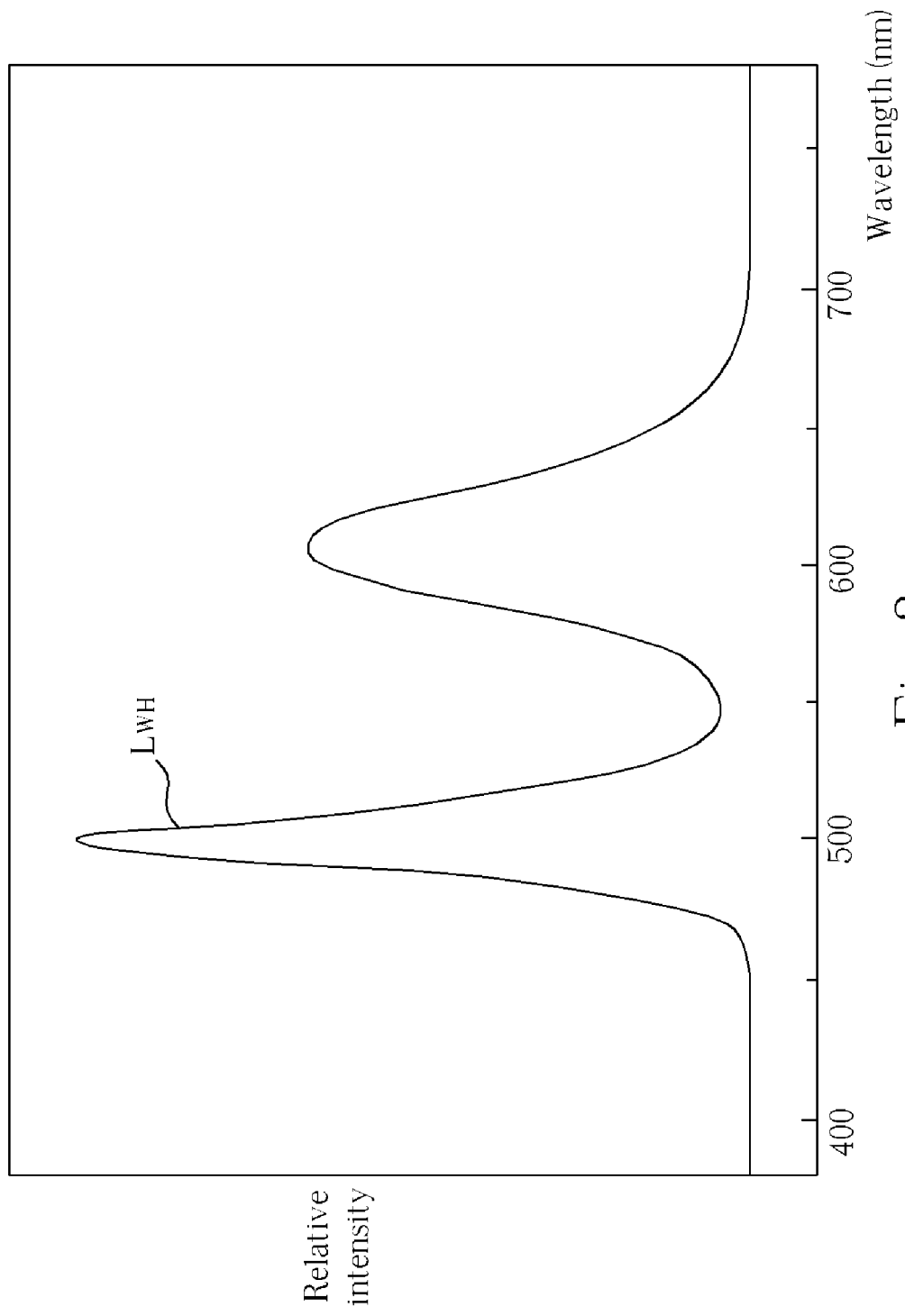
FIG. 3 is a spectral diagram of white light emitted by the W-LED component shown in FIG. 1.
Figure 4:
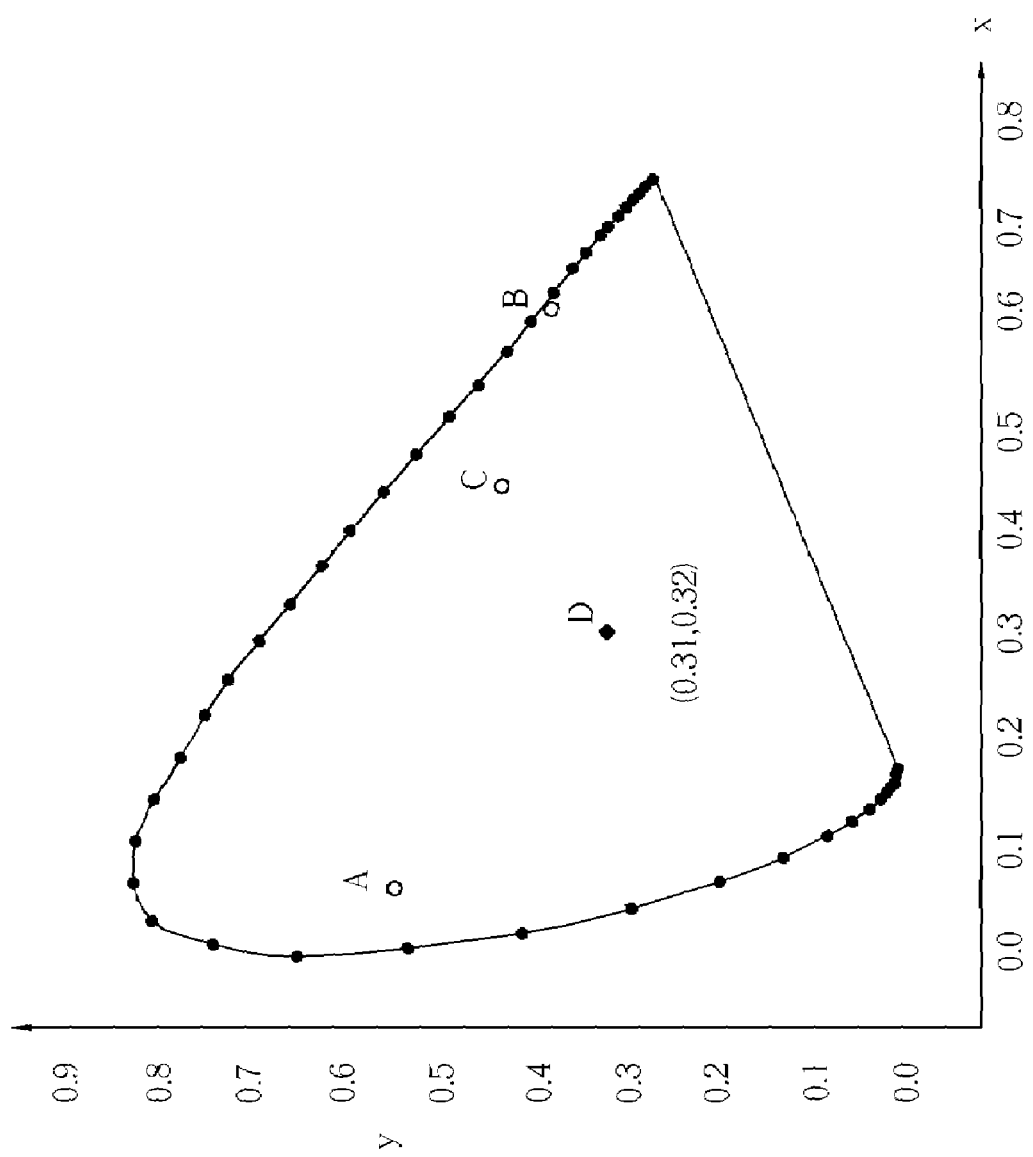
FIG. 4 is a CIE chromaticity diagram of CIE chromaticity coordinates corresponding to the luminescent light $L_{LED}$, the emission $L_{PHO}$, the white light $L_{WH}$ of the present invention, and genuine white light.

Please refer to FIGS. 2–4. FIG. 2 is a spectral diagram of the emission $L_{PHO}$ and the excitation $L_{EX}$ of the phosphor 18, wherein the abscissa represents the wavelengths of the emission $L_{PHO}$ and the excitation $L_{EX}$ and the ordinate represents relative intensity of the emission $L_{PHO}$ and the excitation $L_{EX}$. The x and the y in the chemical formula of the phosphor 18 are equal to 0.005 and 0 respectively. FIG. 3 is a spectral diagram of the white light $L_{WH}$ emitted by the W-LED component 10, where the abscissa represents the wavelength of the white light $L_{WH}$ and the ordinate represents the relative intensity of the white light $L_{WH}$. FIG. 4 is an International Commission on Illumination (CIE) chromaticity diagram of CIE chromaticity coordinates corresponding to the luminescent light $L_{LED}$, the emission $L_{PHO}$, the white light $L_{WH}$ of the present invention, and genuine white light $L_{WHG}$, where the abscissa represents an x-chromaticity coordinate, the ordinate represents a y-chromaticity coordinate, and A(0.0690,0.5483), B(0.6154, 0.3790), C(0.4486, 0.4307), and D(0.31, 0.32) represent four chromaticity points respectively corresponding to the luminescent light $L_{LED}$ having a wavelength equal to 500 nanometers, the emission $L_{PHO}$ excited by the luminescent light $L_{LED}$ having the wavelength equal to 500 nanometers, the white light $L_{WH}$ formed through mixing the emission $L_{PHO}$ and the luminescent light $L_{LED}$ having the wavelength equal to 500 nanometers, and the genuine white light $L_{WHG}$ respectively.

According to the preferred embodiment, the phosphor 18 is formed through a solid-state method, a co-precipitation method, a micro-emulsion method, or a gel method.

These methods have advantages, and disadvantages as well. For example, the co-precipitation method is complicated, but has a short reaction period. It is also is capable of generating small and well-mixed first phosphor 18. The first phosphor, if formed through the micro-emulsion method, has a specific surface area larger than that of phosphor formed through the conventional co-precipitation method.

Figure 5:
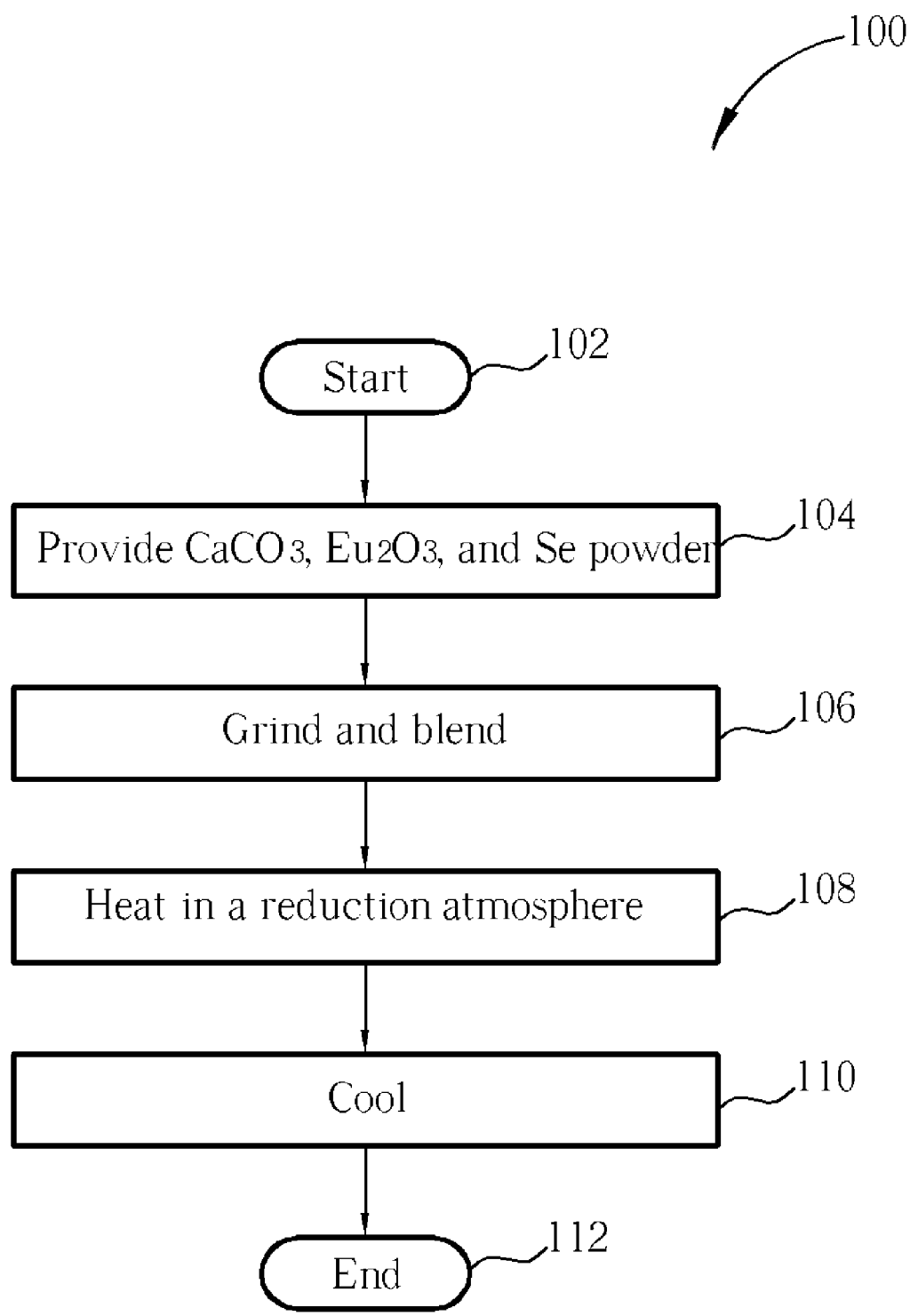
FIG. 5 is a flow chart of a formation method of the phosphor in the W-LED component shown in FIG. 1.

A formation method 100 of the phosphor 18 is described as follows. Please refer to FIG. 5, which is a flow chart of the formation method 100 according to the present invention. The method 100 comprises the following steps:

Step 102: Start;

Step 104: Provide CaCO3, Eu2O3, reactants comprising at least one element selected from a group consisting of Be, Mg, Sr, Ba, and Zn (such as SrO), and Se powder according to a predetermined stoichiometric ratio; (except Se powder, these reactants can be in the form of oxides or salts thereof)

Step 106: Grind and blend the reactants provided in step 104 to form ground and blended powder;

Step 108: Place the ground and blended powder into a reduction atmosphere comprising $H_2/N_2$(5%/95%), heat the ground and blended powder in the reduction atmosphere at a predetermined rate of temperature increase of +5° C./second up to a predetermined temperature of 1200° C., and perform a reduction sintering process for a predetermined time period of four hours to form a chemical compound;

(The reduction sintering process reduces $Eu^{3+}$ ions in the reactants into $Eu^{2+}$ ions, so as to promote the light intensity of the phosphor 18. The predetermined temperature of the reduction sintering process is between 1000° C. and 1600° C. The predetermined time period of the reduction sintering process is between three and 24 hours. The reduction atmosphere comprises hydrogen and nitrogen gas, or hydrogen and argon gas)

Step 110: Twelve hours later, cool the chemical compound formed in step 108 to room temperature at –5° C./second to obtain the phosphor 18; and Step 112: End.

In contrast to the prior art, the present invention can provide a W-LED component having the phosphor and the LED chip 14. The phosphor 18 absorbs part of the luminescent light $L_{LED}$ emitted by the LED chip 14 and emits the emission $L_{PHO}$. The emission $L_{PHO}$ has a wavelength different from a wavelength of the luminescent light $L_{LED}$. Mixing the luminescent light $L_{LED}$ emitted by the LED chip with the emission $L_{PHO}$ forms the white light $L_{WH}$. The phosphor 18 has a chemical formula of $(Ca_{1-x-y}Eu_xM_y)Se$ where x is not equal to zero, y is between zero and one, and M comprises at least one element selected from a group consisting of Be, Mg, Sr, Ba, and Zn. The cheap phosphor 18 replaces the red and green LED chips of the three-in-one W-LED component of the prior art, so the W-LED component of the present invention costs less.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode (LED) component comprising:
   a light-emitting chip for emitting luminescent light; and
   a phosphor for absorbing first luminescent light of the luminescent light and emitting first emission, the first luminescent light having a first wavelength different from that of the first emission, the phosphor having a chemical formula of $(Ca_{1-x-y}Eu_xM_y)Se$ where x is not equal to zero, y is between zero and one, and M comprises at least one element selected from a group consisting of Be, Mg, Sr, Ba, and Zn.

2. The LED component of claim 1, wherein the luminescent light emitted by the light-emitting chip has a dominating wavelength of between 440–510 nanometers.

3. The LED component of claim 1, wherein the phosphor has a particle diameter smaller than 20 micrometers.

4. The LED component of claim 3, wherein the phosphor has an average particle diameter equal to 5 micrometers.

* * * * *